United States Patent [19]

Savage, Jr.

[11] Patent Number: 4,727,648
[45] Date of Patent: Mar. 1, 1988

[54] CIRCUIT COMPONENT MOUNT AND ASSEMBLY

[76] Inventor: John M. Savage, Jr., 538 B Via De La Valle, Solana Beach, Calif. 92075

[21] Appl. No.: 56,051

[22] Filed: Jun. 1, 1987

Related U.S. Application Data

[63] Continuation-in-part of Ser. No. 918,295, Oct. 14, 1986, abandoned, which is a continuation of Ser. No. 725,565, Apr. 22, 1985, abandoned.

[51] Int. Cl.⁴ .............................................. H05K 3/30
[52] U.S. Cl. .................................... 29/839; 362/226; 362/382; 362/800; 439/56; 439/683
[58] Field of Search ............... 362/226, 230, 310, 368, 362/374, 375, 376, 382, 800; 439/55, 56, 660, 77, 675, 58, 682, 683, 691, 699, 741, 743, 751, 842–844, 851–853, 862, 873; 29/837, 838, 839, 840

[56] References Cited

U.S. PATENT DOCUMENTS

| | | | |
|---|---|---|---|
| 1,747,896 | 2/1930 | Gates | 439/682 |
| 2,042,199 | 5/1936 | Thomas | 362/226 |
| 2,796,593 | 6/1957 | Offerman | 439/683 |
| 2,829,359 | 4/1958 | Ritter | 439/56 |
| 2,951,226 | 8/1960 | Gittens | 439/58 |
| 3,335,387 | 8/1967 | Mueller | 439/56 |
| 4,471,414 | 9/1984 | Savage | 362/800 |

*Primary Examiner*—Samuel Scott
*Assistant Examiner*—Noah Kamen
*Attorney, Agent, or Firm*—William W. Haefliger

[57] ABSTRACT

A circuit component such as an electrical unit is mounted to a circuit board, by providing a mounting body to support the unit on the board; providing conductive means including contact structure with spring fingers to receive a nit terminal, the conductive means including auxiliary terminal means to project outwardly of the body via a body slot, the contact structure and auxiliary terminal means defining a bridge portion with tab means in the body slot to anchor the body. The light unit may extend at either end of the body.

16 Claims, 26 Drawing Figures

CIRCUIT COMPONENT MOUNT AND ASSEMBLY

BACKGROUND OF THE INVENTION

This application is a continuation-in-part of Ser. No. 918,295 filed Oct. 14, 1986, which is a continuation of Ser. No. 725,565 filed Apr. 22, 1985, both abandoned.

This invention relates generally to the mounting of circuit components on circuit boards; more particularly it concerns providing a mount that has multiple modes of connection to a circuit board as well as multiple modes of connection to a circuit component, such as an LED for example.

In my U.S. Pat. No. 4,195,330, there is described a means for mounting a light unit such as an LED, for example, to a panel, with unusual advantage.

There is presently a need for mounting circuit components to circuit boards in different ways or positions. To my knowledge, no way was known, prior to the present invention to attach a circuit component such as an LED to a discrete mount, in multiple modes, facilitating its positioning in different ways to a circuit board, or to provide such a mount which optionally connects to the board in different modes, thereby to achieve surprisingly advantageous results as will appear.

SUMMARY OF THE INVENTION

It is a major object of the invention to provide a mount and a method of assembly thereof that facilitate the above described multiple attachment and mounting modes, with attendant further advantages including ease and rapidity of mounting and assembly, low bulk and small overall size, elimination of need for soldered connection of the circuit component to the mount, and no weight imposition on LED leads by circuit components connected to such leads. Basically, the invention is adapted for use in an assembly that includes a light unit having a base, and terminal means projecting from the base, and includes (a) a body having at least one end portion adapted to provide support for the base of the light unit, (b) the body defining cavity means, and there being contact structure in said cavity means for removable endwise reception of said light unit terminal means to establish electrical contact therewith when the base of the light unit is supported by the body end portion, (c) and auxiliary terminal means carried by the body and projecting exteriorly therefrom for reception by a circuit board, thereby to mount the body and light unit on the circuit board, the auxiliary terminal having electrical connection with said contact structure.

Typically, the cavity means extends through the body and opens at opposite ends defined by the body to expose said contact structure to endwise reception of said terminal means via one or the other of said opposite ends; the auxiliary terminal means projects sidewardly, outwardly of the body, and closer to one of said body ends than the other of the body ends; and the circuit component such as light unit has its base located at said one end of the body, with said light unit terminal means in electrical contact with said contact structure, within said cavity means.

Alternatively, the light unit has its base located at said other end of the body, with said light unit terminal means in electrical contact with said contact structure, within said cavity means.

Rather than projecting sidewardly from the body, the terminal means may project endwise of and from one end of the body; and the light unit may have its base located at the opposite end of the body, with said light unit terminal means in electrical contact with said contact structure, within said cavity means.

Further, and as will apear, the cavity means may include two spaced, generally parallel cavities respectively containing first and second contacts defined by said contact structure, said contact including spring fingers to pressurally engage first and second light unit terminals respectively received in said first and second cavities. The circuit or light component terminal means typically projects at least substantially through the cavity and has an end portion remote from said base and retained by said body against relative displacement endwise of the cavity.

Also, the contact structure and auxiliary terminal structure may be integral and attached to the universal mount body, and may be defined by a single metallic sheet having tab means anchoring said sheet to said body.

Another object of the invention is to provide a method for mounting a circuit component (that may or may not be a light unit) to a circuit board in any of a plurality of modes, and using a multi-way mount, the circuit component comprising an electrical unit having a base and terminal means projecting endwise from the base. The steps of the mounting method include:

(a) providing a mounting body to support the unit on the circuit board means, the body defining an axis, cavity means, and slot means intersecting the cavity means and extending generally axially of the body, the body capable of supporting said unit at either of two ends of the body which are axially spaced apart, via said terminal means in said cavity means, (b) providing conductive means including contact structure for electrically connecting said unit with said circuit board means, the contact structure including spring fingers spaced about at least one zone adapted to receive the unit terminal means, in electrical contact therewith, said conductive means including auxiliary terminal means to be integral with said contact structure and the contact structure assembled into the cavity means so that the auxiliary terminal means projects outwardly of the body via said slot means, said contact structure and said auxiliary terminal means being defined by a single metallic sheet having tab means for anchoring the sheet to the body, and said sheet having a bridge portion between said contact structure and said auxiliary terminal means, said bridge portion mounting said tab means deflected from a plane defined by said bridge portion, said plane extending generaly axially of the body, and said assembling carried out to locate said bridge portion in said slot means, (c) assembling the conductive means to the body as aforesaid and the electrical unit to the contact structure so that the unit extends at one of said ends of the body, and (d) joining the auxiliary terminal means to a circuit board.

In this regard, the auxiliary terminal means may be formed to extend outwardly of said mounting body and to project sidewardly thereof generally parallel to the plane of the circuit board in position to the electrically connected to surface means on the board; and the method may include the further step of contact soldering the auxiliary terminal means to the surface means (i.e. circuitry, for example) on the board. For example, the auxiliary terminal means may be formed to define two auxiliary terminals each having L-shape and to project in different directions, parallel to the plane of the circuit board.

These and other objects and advantages of the invention, as well as the details of an illustrative embodiment, will be more fully understood from the following specification and drawings, in which:

DETAILED DESCRIPTION

Figure 20:
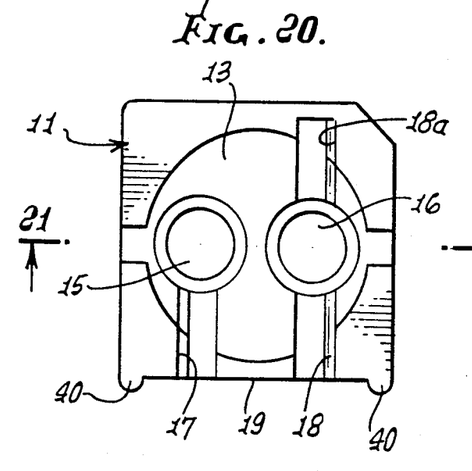
FIG. 20 is a left end elevational view of the Fig. 18 mount.
Figure 21:
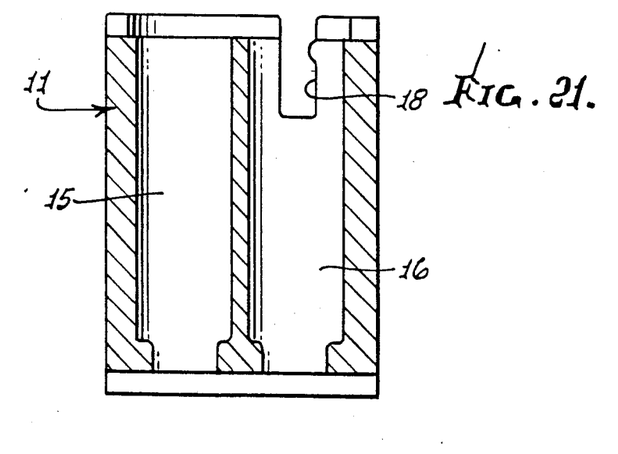
FIG. 21 is a view taken in sections on lines 21—21 of FIG. 20.

Referring first to FIGS. 1-5, and 18-21, a mount 10 includes a one-piece molded plastic body 11 having recessed opposite ends 12 and 13 adapted to serve as supports for circuit components such as light units, one such light unit for example comprising an LED 14. The body defines cavity means such as the two longitudinally extending, laterally spaced cavities 15 and 16 that extend endwise oppositely, and in parallel relation between recessed opposite ends 12 and 13. See also the two cavities 17 and 18 that respectively extend transversely between the cavities 15 and 16 and one side 19 of the mount body, adjacent recessed end 13. A complementary cavity 18a extends in transverse alignment with cavity 17, but at the opposite side of cavity 15. FIG. 20 shows corresponding structure.

A circuit component with terminals is adapted to be supported by the body, the illustrated component such as light unit 14 comprising and LED (or other light unit such as an incandescent lamp or Neon lamp). Unit 14 has two terminals 21 projecting rearwardly from a housing 2, and also within the latter. A luminous chip 23 defines the light emitting zone of the LED. A base flange or arcuate boss is shown at 24, and it flatly engages the end wall 13a of the mount, in FIG. 4, which surrounds recess 13.

Figure 3:
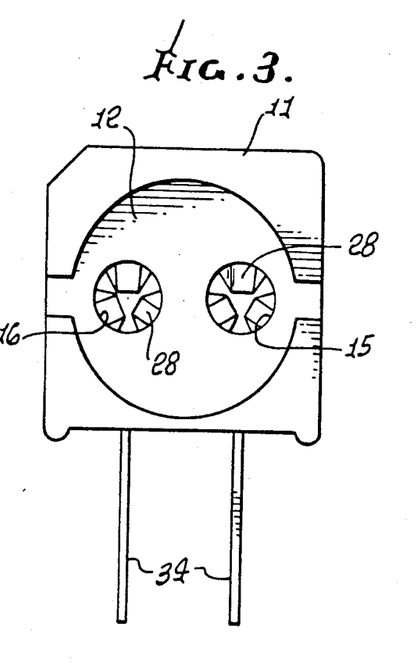
FIG. 3 is a left end elevation taken on lines 3—3 of FIG. 1.
Figures 4, 5:
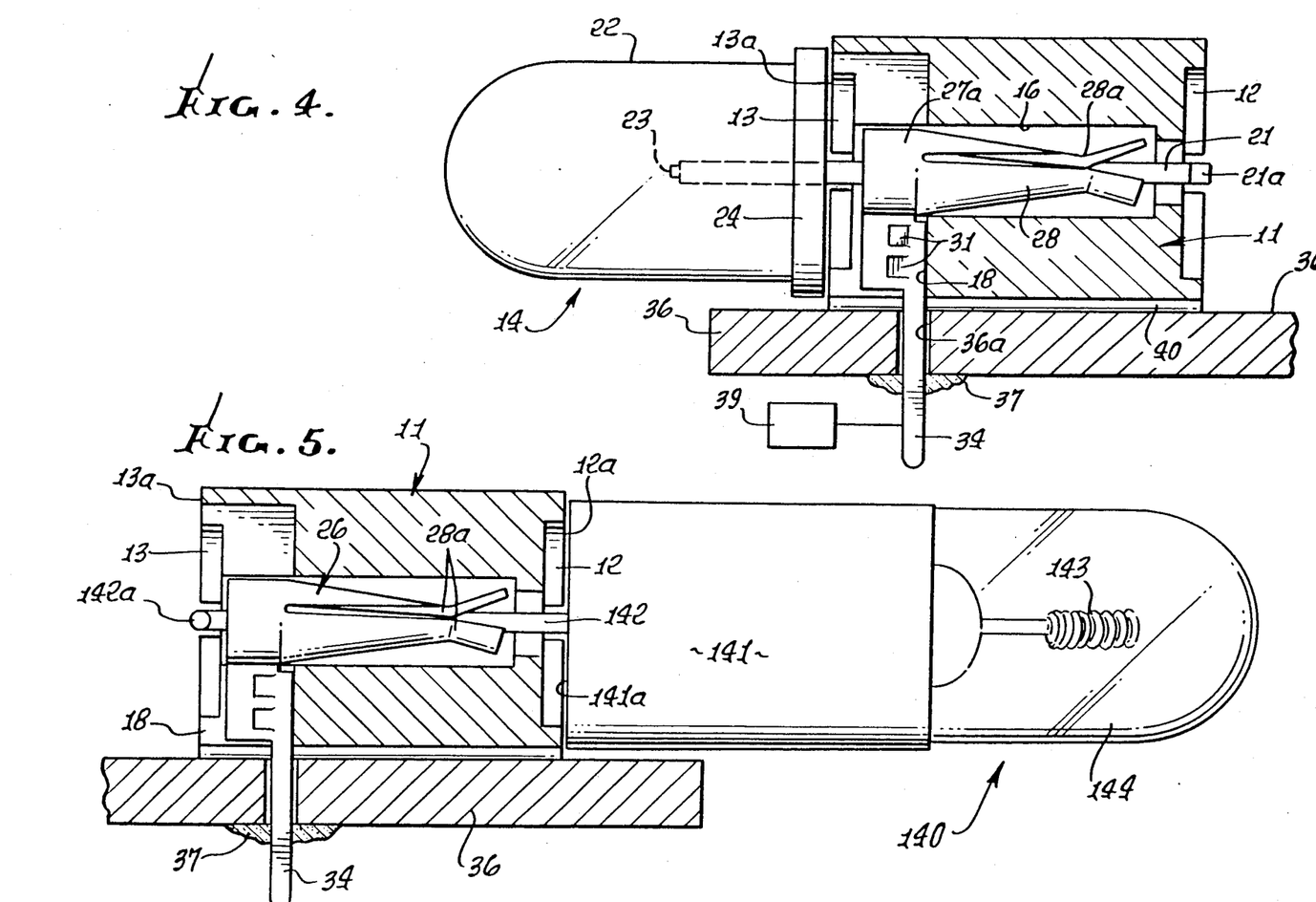
FIG. 4 is a view like FIG. 1, but showing a light unit attached to one end of the FIG. 1 mount, the latter sidewardly attached to a circuit board.
FIG. 5 is another view like FIG. 1, but showing a light unit attached to the opposite end of the FIG. 1 mount, the latter sidewardly attached to a circuit board.
Figures 11, 12, 13, 17:
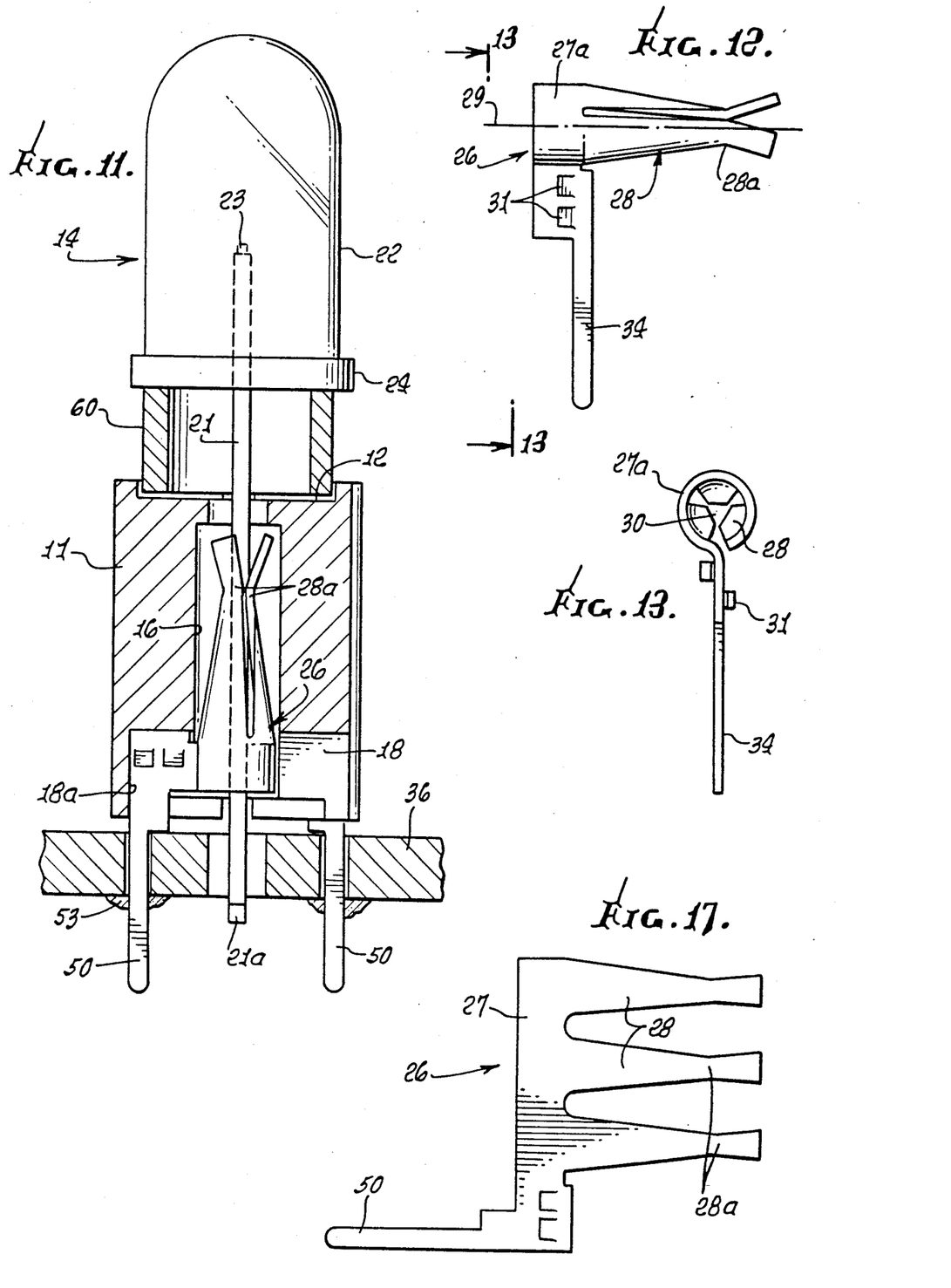
FIG. 11 is a view like FIG. 9, but showing the provision of a spacer between the light unit and the mount.
FIG. 12 is a side elevation showing contact structure as usable in the FIG. 1 mount.
FIG. 13 is an end elevation taken on lines 13—13 of FIG. 12.
FIG. 17 is a view of the FIG. 15 contact structure in as-stamped, flat condition.

The mount 10 also includes contact structure in the body cavity means for removable endwise reception of the terminal means such as terminals 21, to establish electrical contact with same when the base 24 is supported by the body end portion, the position of the unit 14 at one end of the body (see FIG. 4) or when supported at the opposite end of the body (see FIG. 5). See for example the contact structure 26 illustrated in FIGS. 12-14. It includes a contact body 27 in the form of a single electrically conductive, flat (as-stamped) metallic sheet from which laterally spaced spring fingers 28 project longitudinally, in FIG. 14. In FIGS. 12 and 13 the sheet 27 has been rolled into a generally circular arc 27a to locate the three fingers about axis 29, at 120° intervals. Also in FIGS. 12 and 13 the fingers have been deformed to taper rightwardly so that their narrowed portions 28a define a reception zone 30 for a terminal 21, to forcibly grip the latter upon its endwise insertion, as in FIGS. 4 and 5. These views also show the contact structure inserted into a cavity 16. Tabs 31 on the contact structure are received into cavities 17 and 18 anchor the contact structure in position, and the cavities 17 and 18 may receive insulating bonding agent, such as an epoxy resin, to add to the anchoring objective. Note that rolled arcuate section 27a is closely received in the cavity bore to center the contact structure and the fingers, for axial reception of the terminal. Two such contact structures 26 are shown in the two cavities 15 and 16, in FIGS. 1-4.

Figure 14:
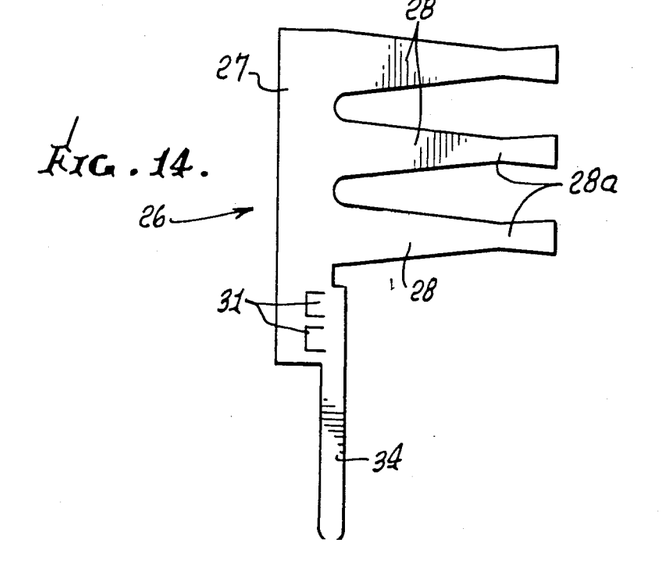
FIG. 14 is a view of the FIG. 12 contact structure in as-stamped flat condition.
Figure 15:
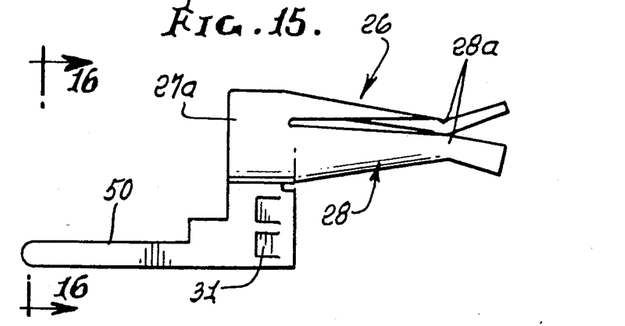
FIG. 15 is a view like FIG. 12, showing modified contact structure as usable in the FIG. 6 mount.
Figure 16:
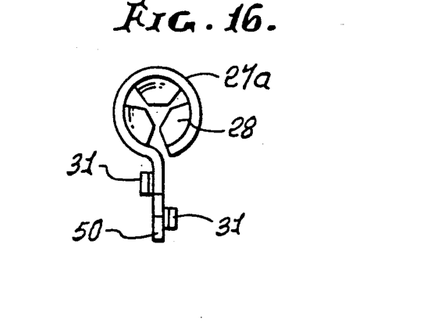
FIG. 16 is an end view taken on lines 16—16 of FIG. 15.
Figure 18:
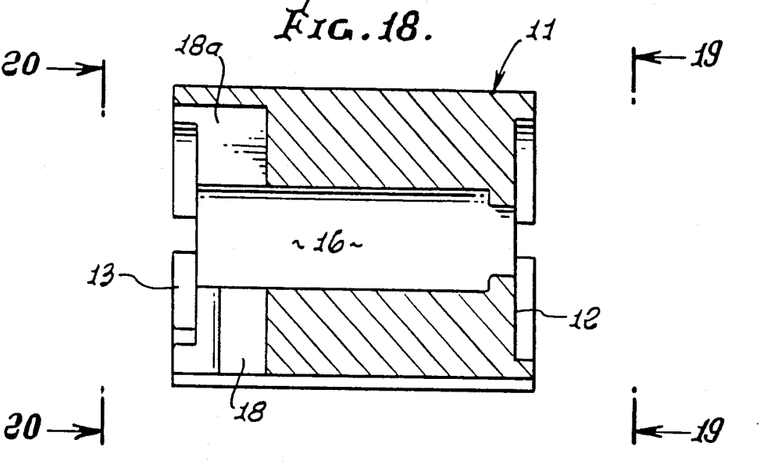
FIG. 18 is a side elevationa, sectional view of the universal mount body, prior to reception of contact structure.
Figure 19:
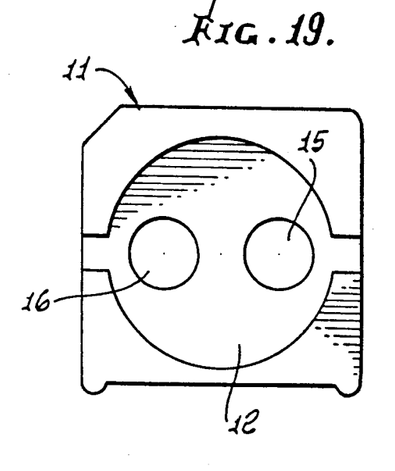
FIG. 19 is a right end elevational view of the FIG. 18 mount.

Auxiliary terminal means 34 also projects sidewardly out of the body 11, and typically closer to body end 13a than to body end 12a. The terminal 34 may be integral with the contact structure 26, as seen in FIGS. 12-14, and it projects via cavity 18 in body 11, to the exterior, for reception by a circuit board 36. FIG. 4 shows board 36 having an opening 36a passing the terminal 34, and solder 37 anchoring the pin or terminal 34 in the position shown. Sheet solder at side 36b of the board may also be employed. Other circuitry connected to terminal 34 is schematically shown at 39. Ribs 40 on body side 19 engage the upper side 36b of the board, whereby the mount is ruggedly attached to the board, with light unit 14 extending parallel thereto. Also, the body is thereby raised from the board to allow trapped flux to be washed away.

In FIG. 5, the light unit takes the form of an incandescent lamp 140 attached to the opposite end 12a of the mount body 11, as shown (of course, and LED or other electrically compound could alternatively be employed, in place of unit 140). The unit 140 has a housing 141 with a base 141a engaging mount end 12a. The two terminals 142 of he unit 140 projects endwise into electrical contact with the gripping spring finger portions 28a. The ends 142a of the terminals may be bent for retaining the terminals and light unit in position, i.e. against withdrawal of contacts 28a. In similar manner, in FIG. 4, the ends 21a of terminal 21 may be bent for retaining the unit 14 against withdrawal form the spring finger contacts. Wire 143 is adapted to become luminous, within glass envelope 144, when electrical current is delivered via terminals 24 to wire 143.

Figure 7:
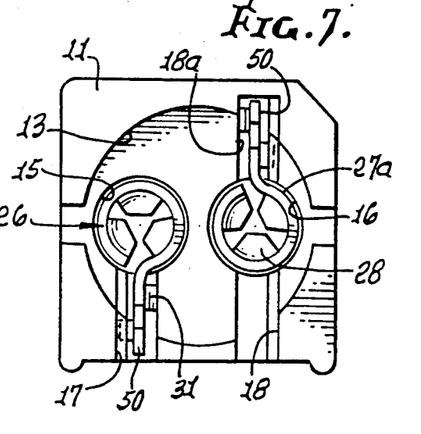
FIG. 7 is a right end elevation taken on lines 7—7 of FIG. 6.
Figure 8:
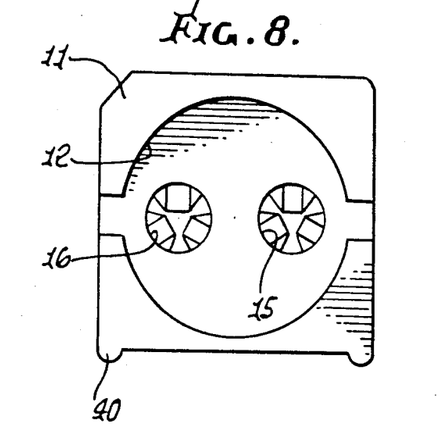
FIG. 8 is a left end view taken on lines 8—8 of FIG. 6.
Figure 9:
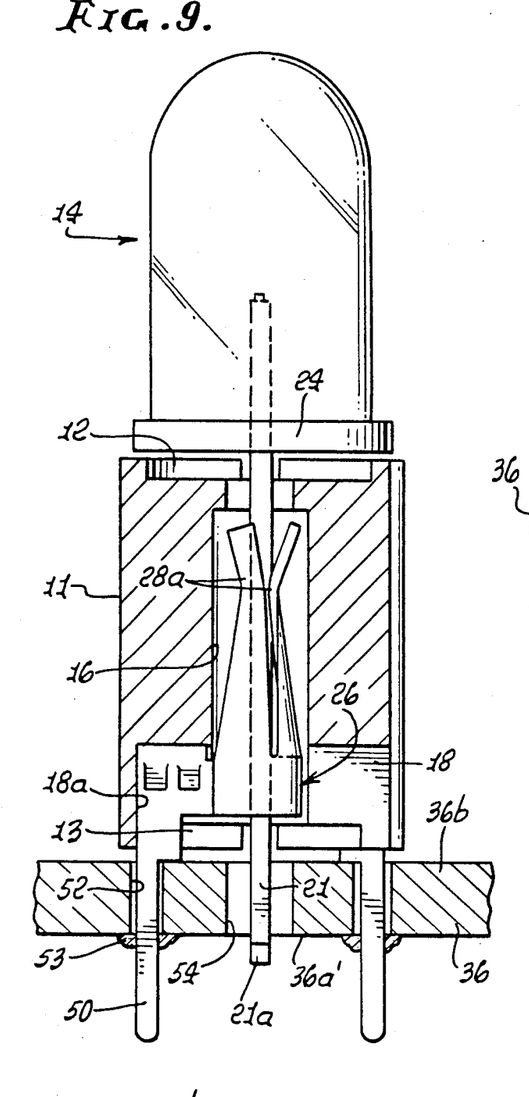
FIG. 9 is a view like FIG. 6, but showing a light unit attached to one end of the FIG. 6 mount, the latter endwise attached to a circuit board.
Figure 10:
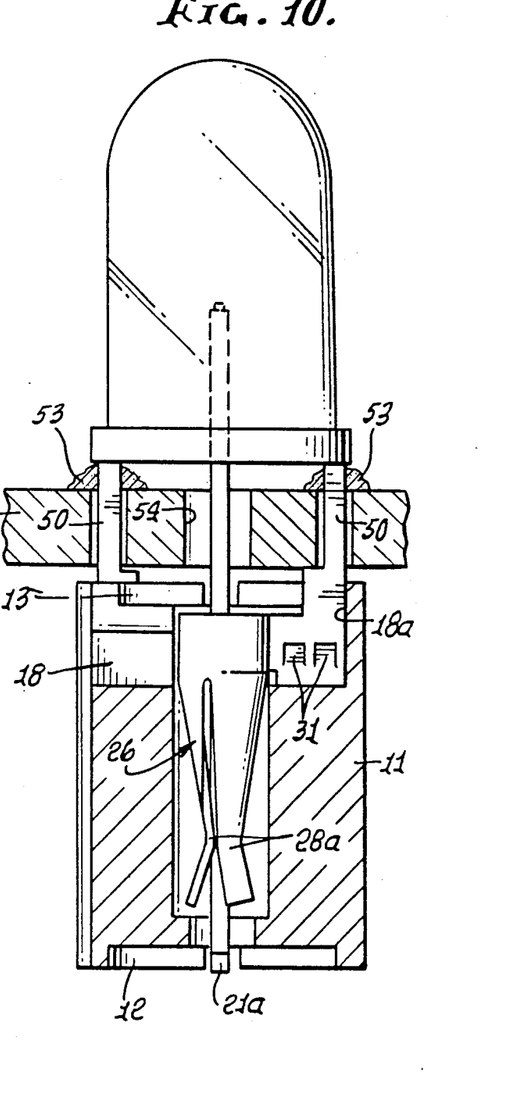
FIG. 10 is another view like FIG. 6, but showing a light unit attached to the opposite end of the FIG. 6 mount, the latter endwise attached to a circuit board.

Referring now to FIGS. 6-10, and 15-17, the structure of the mount body 11 remains the same, whereby the mount is "universal", as respect the different contact structure employed, and the different light units or their modes of mounting, at a selected end of the body. The contact structure body 27 and fingers 28 also remain the same; however, the terminal 50 (corresponding to terminal 34) projects endwise or longitudinally instead of sidewardly, at one lateral end of body 27. Consequently, the two terminals 50 extend endwise of the body 11, in FIGS. 6-10. As a further consequence, as as shown in FIGS. 9 and 10, the light unit and body are enabled to project endwise upright from the circuit board 36, should that mode of mounting be desired. In FIG. 9, the light unit 14 (LED) projects upwardly, remotely from the upper side 36b of the board 36; contact terminals 50 project through the board openings 52 to be soldered at 53; and light unit terminals 21 project through intermediate board openings 54; and ends 21a of the terminals 21 by be turned for retention at board side 36a.

In FIG. 10, the structure is like that shown in FIG. 9, except that the mount 11 and light unit 14 are at opposite sides of the board 36. The mounting of the body 11 to the board is the same as in FIG. 9, except that contact terminals 50 are cut-off proximate the loci of the solder connections 53. The base 24 of the light unit now is located near or seated on the solder connections 53, or the ends of the terminals 50 so that the light unit terminals project back through openings 54 in the board, and into contact with the spring fingers 28, at the opposite side of the board. Ends 21a may be turned, as shown, for retention.

In FIG. 11, the structure is the same as in FIG. 9, excepting that a spacer 60 is located between the light unit base 24 and end portion 12 of the body 11. The spacer extends about terminal 21; and it fits into the recess defined by the end of body 11, for positioning and retention, the end 21a of terminal 21 being typically turned to provide such retention. Note also offsets 80 integral with the contact structures and spacing the body from the base.

Figure 1:
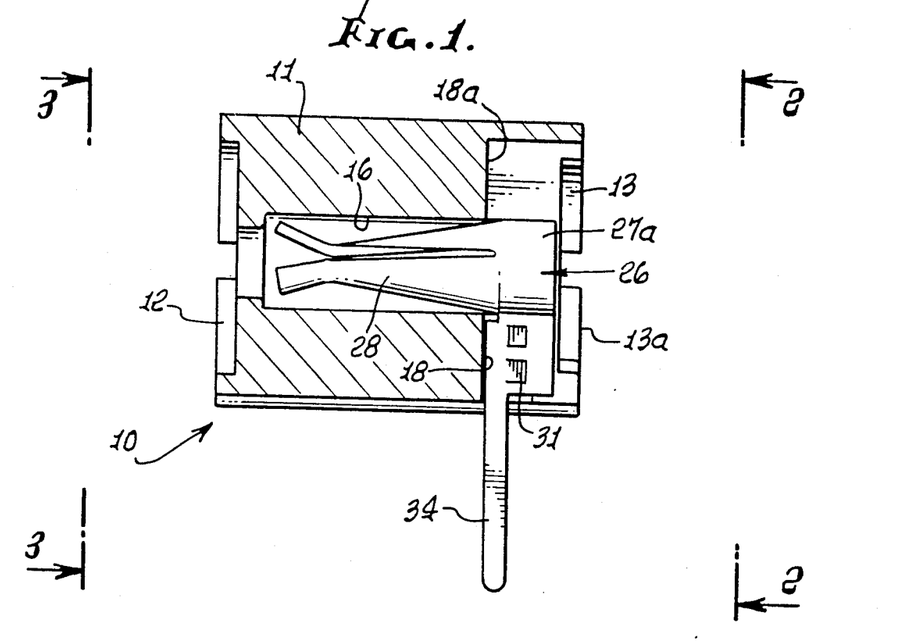
FIG. 1 is a sectional side elevation taken through a circuit component mount.
Figure 2:
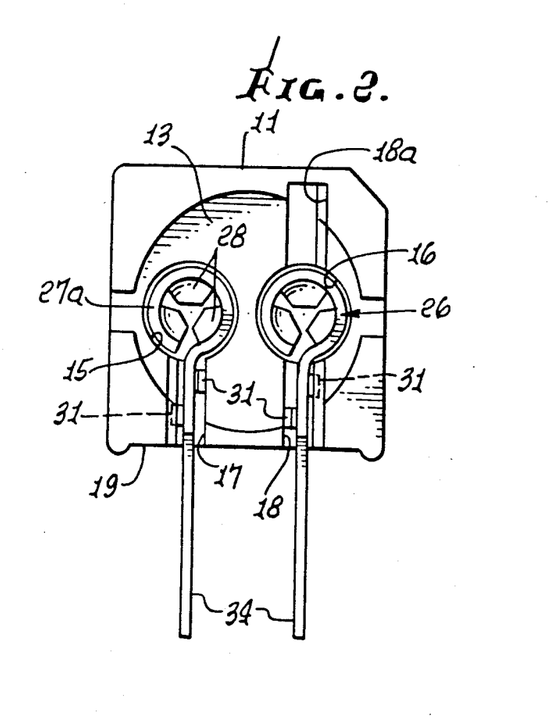
FIG. 2 is a right end elevation taken on lines 2—2 of FIG. 1.
Figure 22:
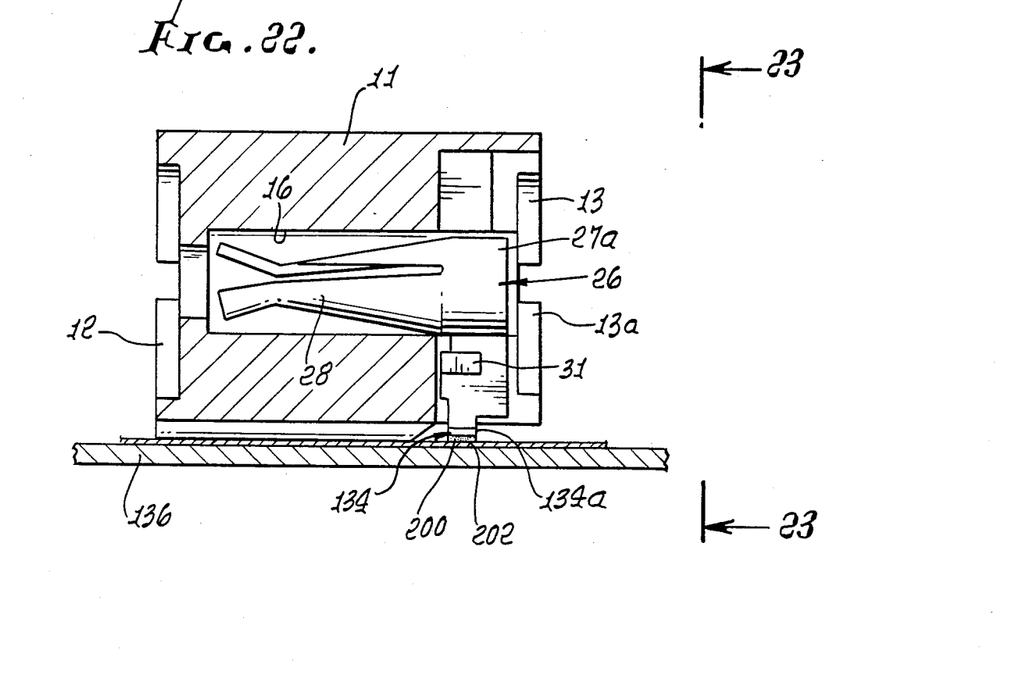
FIG. 22 is a view like FIG. 1, showing a further modification.
Figure 23:
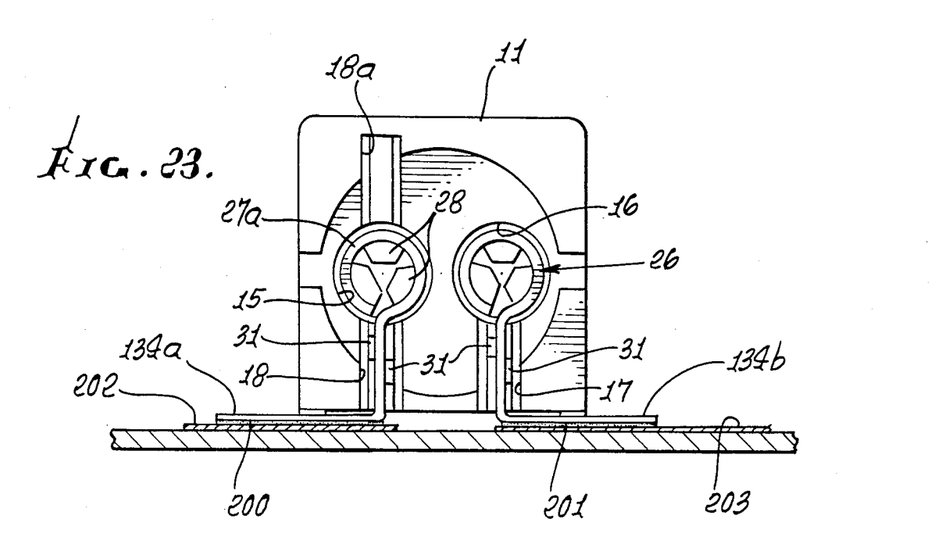
FIG. 23 is an end view on lines 23—23 of FIG. 22.

In FIGS. 22 and 23, the structure is the same as in FIGS. 1-3, and bears the same numbers for corresponding parts, excepting for the auxiliary terminal means 134. The latter is formed to extend outwardly of the mounting body 11 and to project sidewardly thereof, generally parallel to the plane of the current board 136; thus, the two auxiliary terminals 134a and 134b are seen in FIG. 23 to have L-shape and to project in different directions, as for example, laterally oppositely of the body, at one side thereof, but parallel to the plane of the circuit board. The auxiliary terminals are electrically connected at 200 and 201 to surface means such as circuitry 202 and 203 on the board surface. For example, the terminals may be contact surface soldered to the surface circuitry on the board, at either side of the board, enabling dense population of such circuit components on the board, at either or both sides thereof.

Figure 6:
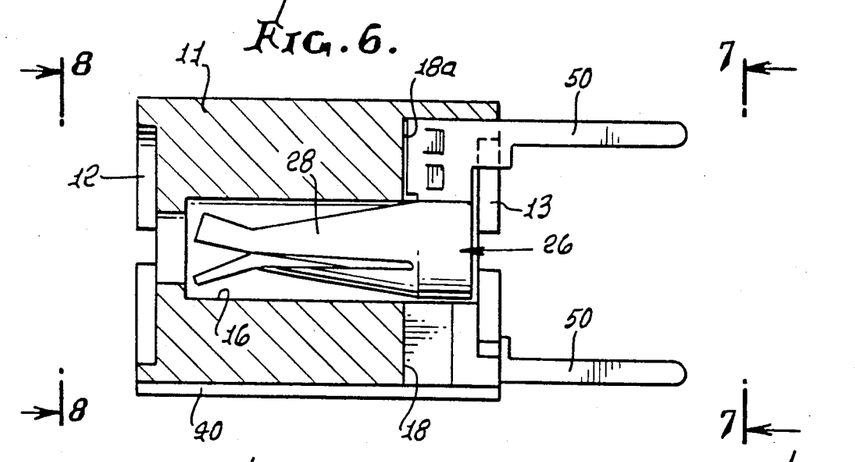
FIG. 6 is a view like FIG. 1, showing a modified circuit component mount.
Figure 24:
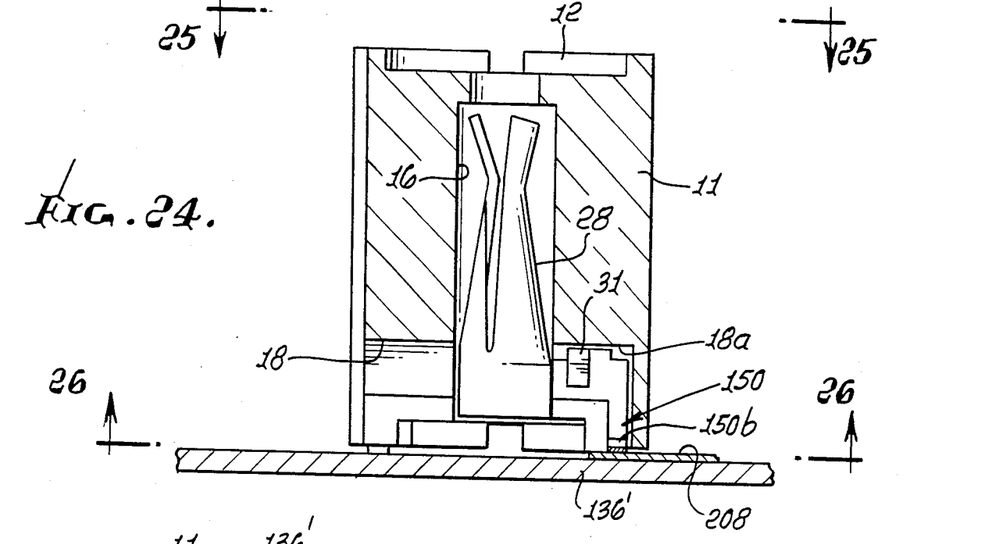
FIG. 24 is a view like FIG. 6 showing yet another modification.
Figures 25, 26:
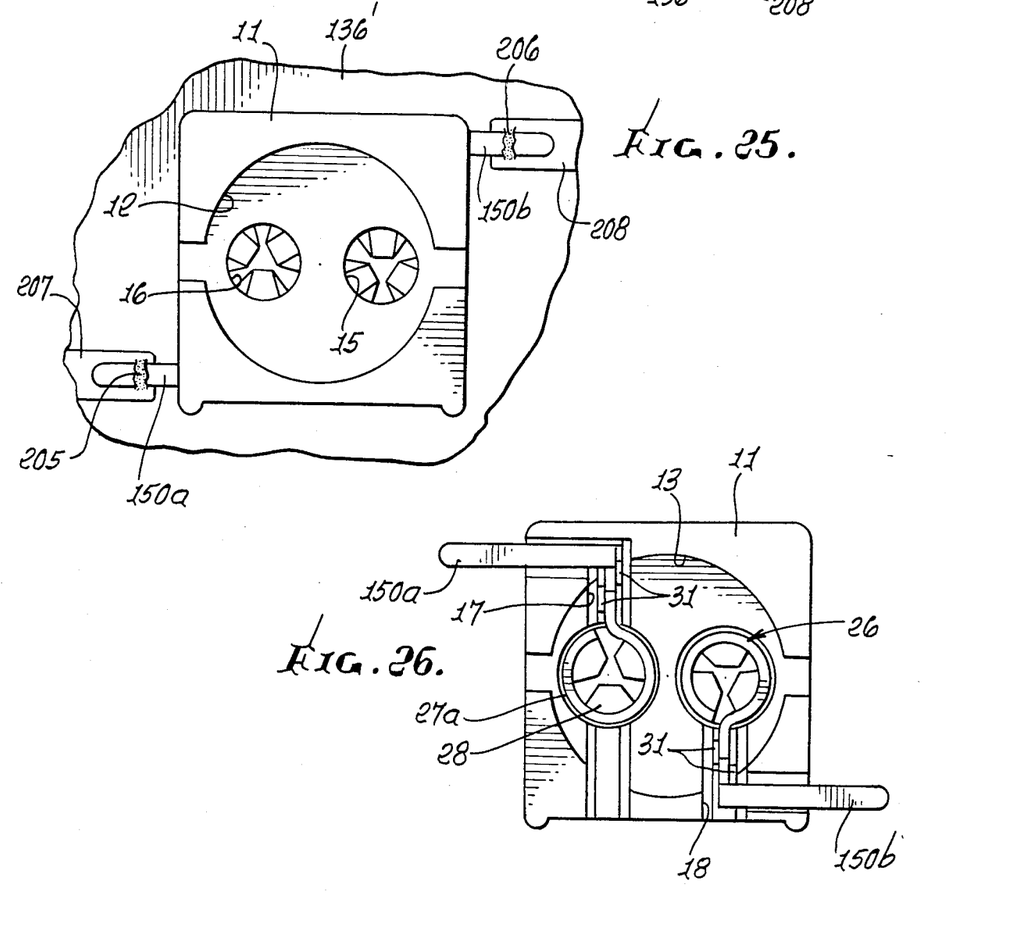
FIG. 25 is an end view taken on lines 25—25 of FIG. 24.
FIG. 26 is an end view taken on lines 26—26 of FIG. 24.

In FIGS. 24-26, the structure is the same as in FIGS. 6-8, and bear the same identifying numerals for corresponding parts excepting for the auxiliary terminal means 150. The latter is formed to extend outwardly of the mounting body 11 and to project sidewardly thereof, generally parallel to the plane of the circuit board 136'; thus, the two auxiliary terminals 150a and 150b are seen in FIG. 26 to have L-shape and to project in different directions, as for example in laterrally opposite directions at one end of the mounting body, but parallel to the plane of the circuit board. These two auxiliary terminals are electrically connected at 205 and 206 to surface means such as circuitry 207 and 208 on the board surface at one side of the board. For example, and as before, these terminals may be contact surface soldered to the surface circuitry on the board, at either side of the board, enabling dense population of such circuit components on the board, at either or both sides thereof.

From the foregoing, a novel method is provided for mounting a circuit component to a circuit board means in any of a plurality of modes, using a multi-way mount, said component comprising an electrical unit having a base and terminal means projecting endwise from the base, the steps that include:

(a) providing a mounting body to support the unit on the circuit board means, the body defining an axis, cavity means, and slot means intersecting the cavity means and extending generally axially of the body, the body capable of supporting said unit at either of two ends of the body which are axially spaced apart, via said terminal means in said cavity means, (b) providing conductive means including contact structure for electrically connecting said unit with said circuit board means, the contact structure including spring fingers spaced about at least one zone adapted to receive the unit terminal means, in electrical contact therewith, said conductive means including auxiliary terminal means to be integral with said contact structure and the contact structure assembled into the cavity means so that the auxiliary terminal means projects outwardly of the body via said slot means, said contact structure and said auxiliary terminal means being defined by a single metallic sheet having tab means for anchoring the sheet to the body, and said sheet having a bridge portion between said contact structure and said auxiliary terminal means, said bridge portion mounting said tab means deflected from a plane defined by said bridge portion, said plane extending generaly axially of the body, and said assembling carried out to locate said bridge portion in said slot means, (c) assembling the conductive means to the body as aforesaid and the electrical unit to the contact structure so that the unit extends at one of said ends of the body, and (d) joining the auxiliary terminal means to a circuit board.

I claim:

1. In the method of mounting a circuit component to a circuit board means in any of a plurality of modes, using multi-way mount, said component comprising an electrical unit having a base and terminal means projecting endwise from the base, the steps that include:
   (a) providing a mounting body to support the unit on the circuit board means, the body defining an axis, cavity means, and slot means intersecting the cavity means and formed in a generally axially parallel plane, the body capable of supporting said unit at either of two ends of the body which are axially spaced apart, via said terminal means in said cavity means,
   (b) providing conductive means including contact structure for electrically connecting said unit with said circuit board means, the contact structure including spring fingers spaced about at least one zone adapted to receive the unit terminal means, in electrical contact therewith, said conductive means including auxiliary terminal means to be integral with said contact structure and the contact structure assembled into the cavity means so that the auxiliary terminal means projects outwardly of the body via said slot means, said contact structure and said auxiliary terminal means being defined by a single metallic sheet having tab means for anchoring the sheet to the body, and said sheet having a bridge portion between said contact structure and said auxiliary terminal means, said bridge portion mounting said tab means deflected from a plane defined by said bridge portion, said plane extending generally axially of the body, and said assembling carried out to locate said bridge portion in said slot means,
   (c) assembling the conductive means to the body as aforesaid and the electrical unit to the contact structure so that the unit is disposed at one of said ends of the body, and
   (d) joining the auxiliary terminal means to a circuit board.

2. The method of claim 1 wherein the terminal means is located to extend laterally of the body.

3. The method of claim 1 including providing said tab means to include two tabs respectively projecting at opposite sides of and away from said bridge portion, and offset from different portions of said bridge portion along the length thereof in a direction between said auxiliary terminal means and said contact structure.

4. The method of claim 1 wherein said auxiliary terminal means is located to extend axially of the body.

5. The method of claim 4 wherein said step of providing the mounting body to support the unit on the circuit board is carried out to locate the mounting body axis normal to the circuit board, with the mounting body and unit at the same side of the board.

6. The method of claim 4 wherein said step of providing the mounting body to support the unit on the circuit board is carried out to locate the mounting body axis normal to the circuit board, with the mounting body and unit at opposite sides of the circuit board.

7. The method of claim 5 including providing a spacer between the unit and the mounting body.

8. The method of claim 1 wherein the auxiliary terminal means is generally flat and is formed to lie extend outwardly of said mounting body and to project sidewardly thereof generally parallel to the plane of the circuit board, in position to be electrically connected to surface means on the board.

9. The method of claim 8 including contact surface soldering the auxiliary terminal means to said surface means on the board.

10. The method of claim 9 wherein said auxiliary terminal means is formed to define two auxiliary terminals each having L-shape and to project in different directions.

11. The method of claim 1 wherein said slot means is formed to extend generally endwise relative to the body axis.

12. The method of claim 8 wherein said slot means is formed to extend generally endwise relative to the body axis.

13. The method of claim 1 wherein said slot means is formed to extend laterally relative to the body axis.

14. The method of claim 8 wherein said slot means is formed to extend laterally relative to the body axis.

15. The method of claim 12 wherein the auxiliary terminal means is formed to define two auxiliary terminals that project laterally oppositely to one another at one side of the body.

16. The method of claim 14 wherein the auxiliary terminal means is formed to define two auxiliary terminals that project in laterally opposite directions to one another at one end of the mounting body.

* * * * *